United States Patent [19]

Heimbigner

[11] 4,363,978

[45] Dec. 14, 1982

[54] REDUCED POWER TRISTATE DRIVER CIRCUIT

[75] Inventor: Gary L. Heimbigner, Anaheim, Calif.

[73] Assignee: Rockwell International Corporation, El Segundo, Calif.

[21] Appl. No.: 174,089

[22] Filed: Jul. 31, 1980

[51] Int. Cl.³ ...................... H03K 19/092; H03K 3/26
[52] U.S. Cl. .................................... 307/451; 307/473; 307/445; 307/270
[58] Field of Search ............... 307/473, 270, 571, 296, 307/445, 448, 451; 328/205

[56] References Cited

U.S. PATENT DOCUMENTS

| | | | |
|---|---|---|---|
| 3,792,292 | 2/1974 | Priel | 307/473 |
| 3,906,255 | 9/1975 | Menschji | 307/473 |
| 4,037,114 | 7/1977 | Stewart et al. | 307/473 |
| 4,194,131 | 3/1980 | Mrazek et al. | 307/473 |
| 4,194,132 | 3/1980 | Mrazek | 307/473 |
| 4,280,065 | 7/1981 | Minato et al. | 307/473 |

Primary Examiner—Stanley D. Miller
Assistant Examiner—B. P. Davis
Attorney, Agent, or Firm—H. Fredrick Hamann; James F. Kirk

[57] ABSTRACT

A tristate driver circuit is provided having a logic input signal, to produce a logic 1 output level or a logic 0 output level, and a float input signal, to produce float state operation. The circuit comprises a first logic gate powered by a first buffer switch, a second logic gate powered by a second buffer switch, an output driver having a first driver input from the output of the first gate and a second signal driver input from the output of the second gate; the first and second buffer switches dissipating the greatest circuit power during the circuit float state operation, and means, coupled to the first and second buffer switches and to the source of float signal input signal, for interrupting power to the first and second buffer switches responsive to onset of the float state operation.

17 Claims, 3 Drawing Figures

REDUCED POWER TRISTATE DRIVER CIRCUIT

BACKGROUND OF THE INVENTION

1. Field of the Invention

This invention relates to integrated circuits, and particularly to metal oxide semiconductor large scale integrated circuit (MOS LSI) devices having n-channel or p-channel MOS field effect transistors, such as are commonly used in hand calculators, home and office computers, automotive and industrial control systems and other commercial products. MOS LSI devices use numerous circuit designs to achieve specific functions. One of the circuit designs used in MOS LSI devices is a tristate driver circuit, i.e., a circuit which has a first or logic 1 state, a second or logic 0 state and a third or float state operation as output states, and which interfaces with and functions to drive output loads, normally external to the MOS LSI, in response to low power signal sources within the MOS LSI, and to disconnect the tristate driver circuit output from the output load when commanded to begin float state operation, in response to a float command.

The advantage that a tristate driver circuit has over a two state driver circuit (no float state) is that when the former circuit is commanded to the third or float state, no voltage is provided to the output load. The output of the circuit appears to be disconnected from the output load. The outputs of more than one tristate driver circuit can therefore be connected to the same output load.

The principal advantage of this tristate driver circuit is that it substantially reduces the internal power consumption with no sacrifice in speed. This makes it possible to expand the number of circuits available in a given MOS LSI device where the available power is limited.

2. Description of the Prior Art

Presently known tristate driver circuits are usually comprised of: NOR gates; buffer switches for pulling up the output of the NOR gates; and an output driver stage that applies voltage to the output load. Such tristate driver circuits dissipate the greatest amount of system power when the float state, because the NOR circuits used in these tristate driver circuits rely on a buffer switch to provide power to the output of the NOR gate. The buffer switches used in MOS LSI devices can be made highly conductive or slightly conductive, but they can not be cut off completely. With the output of the NOR circuit low, the respective buffer switch must drop the power supply voltage ($V_{DD}$-$V_{SS}$), and the power dissipated in the buffer switch is undesirably high, because the switch continues to provide a small bias current although turned off.

Patents in the field of the invention include: U.S. Pat. No. 4,194,131, "TRISTATE LOGIC BUFFER CIRCUIT WITH ENHANCED DYNAMIC RESPONSE" and U.S. Pat. No. 4,194,132, "TRISTATE LOGIC BUFFER CIRCUIT WITH REDUCED POWER CONSUMPTION" both issued on Mar. 18, 1980 to Dale A. Mrazek. Both of these patents differ substantially in topology from the present invention and neither teaches method or means for reducing the power consumed in a tristate driver circuit using MOS FET transistors.

SUMMARY OF THE INVENTION

It is a major objective of this invention to substantially reduce the power dissipation in the buffer switches used with NOR gates relative to the power dissipated in the buffer switches of previously known tristate driver circuits. In addition, the tristate driver circuit of the invention taught herein in accordance with another object of the invention, provides lower operating power in the logic 1 and logic 0 states than known tristate driver circuits.

Other objectives of this invention include provision of a tristate driver circuit for use in MOS LSI devices characterized by: reduced circuit power dissipation in each of the three states of operation of the circuit and substantially reduced bias current through the NOR gate buffer switches, while receiving a float state command.

It is a further objective of the invention to enable the designer of the MOS LSI circuits to use larger numbers of these circuits where the higher power required by previously known circuits would otherwise preclude such larger number use.

It is still another objective of the invention to achieve the foregoing in a circuit with essentially the same level of complexity as previous circuits, and without a loss in circuit speed.

It is a highly particular objective of the invention to incorporate switch means in a tristate driver circuit, to reduce power in the float state operation.

It is another highly particular objective of the invention to provide a tristate driver circuit adapted for manufacture exclusively from n-channel field effect transistors or exclusively from p-channel field effect transistors. These and other objectives of the invention are realized in a tristate driver circuit for operation between a voltage source and a reference potential such as ground and being particularly adapted for fabrication exclusively from n-channel field effect transistors or exclusively from p-channel field effect transistors. The invention circuit is adapted to receive an input signal and a complement input signal to produce a logic one output level or a logic zero output level and is further adapted to receive a float input signal and a complement float input signal to produce float state operation. The circuit comprises: a first logic gate having a first and second signal gate input terminal, a power gate input terminal, and an output terminal; a second logic gate having a first and second signal gate input terminal, a power gate input terminal, an output terminal; a first and second buffer switch, each buffer switch having a conduction channel having a respective first and second terminal and a control grid. The first buffer switch conduction channel second terminal is connected to the first logic gate power gate input terminal, the second buffer switch conduction channel second terminal is connected to the second logic gate power gate input terminal. The invention circuit also includes an output driver having a first signal driver input from the output terminal of the first logic gate and a second signal driver input from the output terminal of the second logic gate. The first buffer switch control grid is connected to the second logic gate second signal gate input terminal and is also connected to the complement input signal. The second buffer switch control grid is connected to the first logic gate second signal gate input terminal and is also connected to the input signal. The first and second logic gate first signal gate input terminals are coupled to the float input signal, means for interrupting power from the voltage source to the respective first and second buffer switch conduction channel first terminals. The means for interrupting power has a first and second terminal, a complement float input signal terminal, and a power input terminal, the means for interrupting power first terminal is connected to the first buffer switch conduction channel first terminal. The means for interrupting power second terminal is connected to the second buffer switch conduction channel first terminal. The power input terminal is connected to the voltage source, the complement float input signal terminal is connected to the complement float input signal. The means for interrupting power is responsive to the complement float input signal; whereby, the means for interrupting power operates to reduce the power dissipation of the first and second buffer switches at the onset of the float state operation.

In an alternative preferred embodiment, the means for interrupting power to the first and second buffer switches further comprise a first and fifth depletion mode insulated gate field effect transistor, each respective field effect transistor having a control grid and a conduction channel having a first and second terminal, the first and fifth field effect transistor conduction channel first terminals being connected to the means for interrupting power power input terminal, the first field effect transistor conduction channel second terminal being connected to the means for interrupting power first terminal, the fifth field effect transistor conduction channel second terminal being connected to the means for interrupting power second terminal, the first and fifth field effect transistor control grids being connected to the means for interrupting power complement float input signal terminal; whereby, the first and fifth field effect transistors operate to reduce the power dissipation of the first and second buffer switches during float state operation.

In yet another alternative embodiment of the invention tristate driver circuit, the first and second buffer switches further comprise a second and sixth depletion mode insulated gate field effect transistor, each respective field effect transistor having a control grid and a conduction channel having a first and second terminal. The second field effect transistor conduction channel first terminal is connected to the power interrupting means first terminal, the sixth field effect transistor conduction channel first terminal is connected to the power interrupting means second terminal. The second field effect transistor conduction channel second terminal is connected to the first logic gate power input terminal, the sixth field effect transistor conduction channel second terminal is connected to the second logic gate power input terminal. The second field effect transistor control grid is connected to the first buffer switch control grid, the sixth field effect transistor control grid is connected to the second buffer switch control grid. The first and second buffer switches thereby operate in response to the logic input signal and the complement logic input signal to apply bias power to only one of the logic gates and during float state operation one of the buffer switches will operate in series with the means for interrupting power to provide an additional power interruption to its respective logic gate.

In another more particular alternative preferred embodiment, the first logic gate further comprises a third and fourth enhancement mode, insulated gate field effect transistor, the second logic gate further comprises a seventh and eighth enhancement mode insulated gate field effect transistor, the output driver further comprises a ninth and tenth enhancement mode insulated gate field effect transistor. Each respective field effect transistor has a respective control grid and a respective conduction channel having a first and second terminal. The third and fourth field effect transistor conduction channel first terminals are connected to the first logic gate power input terminal, the third and fourth field effect transistor conduction channel second terminals are connected to the voltage reference, the third field effect transistor control grid is connected to the first logic gate second input, the fourth field effect transistor control grid is connected to the first logic gate first input the seventh and eighth field effect transistor conduction channel first terminals are connected to the second logic gate power input terminal, the seventh and eighth field effect transistor conduction channel second terminals are connected to the reference potential. The seventh field effect transistor control grid is connected to the second logic gate second input, the eighth field effect transistor control grid is connected to the second logic gate first input. The first logic gate power input terminal is connected to the output of the first logic gate and the second logic gate power input terminal is connected to the output of the second logic gate.

In another even more particular alternative preferred embodiment of the invention tristate driver circuit, the first and second buffer switches further comprise: a second and sixth depletion, mode insulated gate field effect transistor, each respective field effect transistor having a control grid and a conduction channel having a first and second terminal. The second field effect transistor conduction channel first terminal is connected to the power interrupting means first terminal. The sixth field effect transistor conduction channel first terminal is connected to the power interrupting means second terminal. The second field effect transistor conduction channel second terminal is connected to the first logic gate power input terminal. The sixth field effect transistor second terminal is connected to the second logic gate power input terminal. The second field effect transistor control grid is connected to the first buffer switch control grid. The sixth field effect transistor control grid is connected to the second buffer switch control grid.

In still yet another even more particular alternative preferred embodiment of the invention tristate driver circuit, the first logic gate further comprises: a third and fourth enhancement mode, insulated gate field effect transistor. The second logic gate further comprises: a seventh and eighth enhancement mode, insulated gate field effect transistor. The output driver further comprises: a ninth and tenth enhancement mode, insulated gate field effect transistor. Each respective field effect transistor has a respective control grid and a respective conduction channel having a first and second terminal. The third and fourth field effect transistor conduction channel first terminals are connected to the first logic gate input terminal. The third and fourth field effect transistor conduction channel second terminals are connected to the voltage reference. The third field effect transistor control grid is connected to the first logic gate second input. The fourth field effect transistor control grid is connected to the first logic gate first input. The seventh and eighth field effect transistor conduction channel first terminals are connected to the second logic gate power input terminal. The seventh and eighth field effect transistor conduction channel second terminals are connected to the reference potential. The seventh field effect transistor control grid is connected to the second logic gate second input. The eighth field effect transistor control grid is connected to the second logic gate first input. The first logic gate power input terminal is connected to the output of the first logic gate and the second logic gate power input terminal is connected to the output of the second logic gate.

In another alternative embodiment of the preferred embodiment, the field effect transistors of each of the foregoing embodiments are n-channel field effect transistors and the voltage source is a positive voltage source with respect to the reference potential and the first logic level is a relatively positive voltage with respect to the second logic level.

In an alternative embodiment, the field effect transistors are p-channel field effect transistors the voltage source is a negative voltage with respect to the reference potential and, wherein, the first logic level is a relatively negative voltage with respect to the second logic level.

In a particularly preferred embodiment, the tristate driver is adapted to operate between a power source and a reference potential and comprises: means providing an input signal and its complement; means providing a float input signal and its complement; a first gate, a second gate, each of the first and second gates having a power gate input terminal adapted to be coupled to the power source; a first signal gate input terminal, a second signal gate input terminal, and a gate output terminal; a first and second buffer switch, each buffer switch having a control electrode, and a conduction path, the first and second buffer switch conduction paths being connected between the power source and the respective first and second gate power input terminals, respectively; and output driver having a first signal driver input terminal connected to the first gate output terminal, a second signal driver input terminal connected to the second gate output terminal, and a driver output terminal; the first gate first signal gate input terminal being connected to: the means providing a float input signal, and to the second gate first signal gate input terminal; the first gate second signal gate input terminal being connected to: the means providing an input signal, and to the second buffer switches control electrode; the second gate second signal gate input terminal being connected to: the means providing a complement float input signal, and to the first buffer switch control electrode; and means for interrupting power to the first and second conduction paths of the first and second buffer switches respectively responsive to a signal from the complement float input signal means.

As in the earlier embodiment, the tristate driver circuit of the preferred embodiment typically includes first and second gates, first and second buffer switches, and an output driver; the means for interrupting power to the first and second gates responsive to a signal from the complement signal source means is typically comprised of multi-terminal semiconductor devices, each of the devices having a conduction path and a control electrode, e.g., FET transistors.

Also as in the previous embodiment, the foregoing preferred embodiment typically has the first and second gates as NOR gates. Additionally, one or the other or both of the mentioned first or second gate of the circuit preferably have three or more input terminals.

BRIEF DESCRIPTION OF THE DRAWINGS

The invention will be further described as to an illustrative embodiment in conjunction with the accompanying drawings in which.

DESCRIPTION OF THE PREFERRED EMBODIMENT

1. Circuit Description

Figure 1:
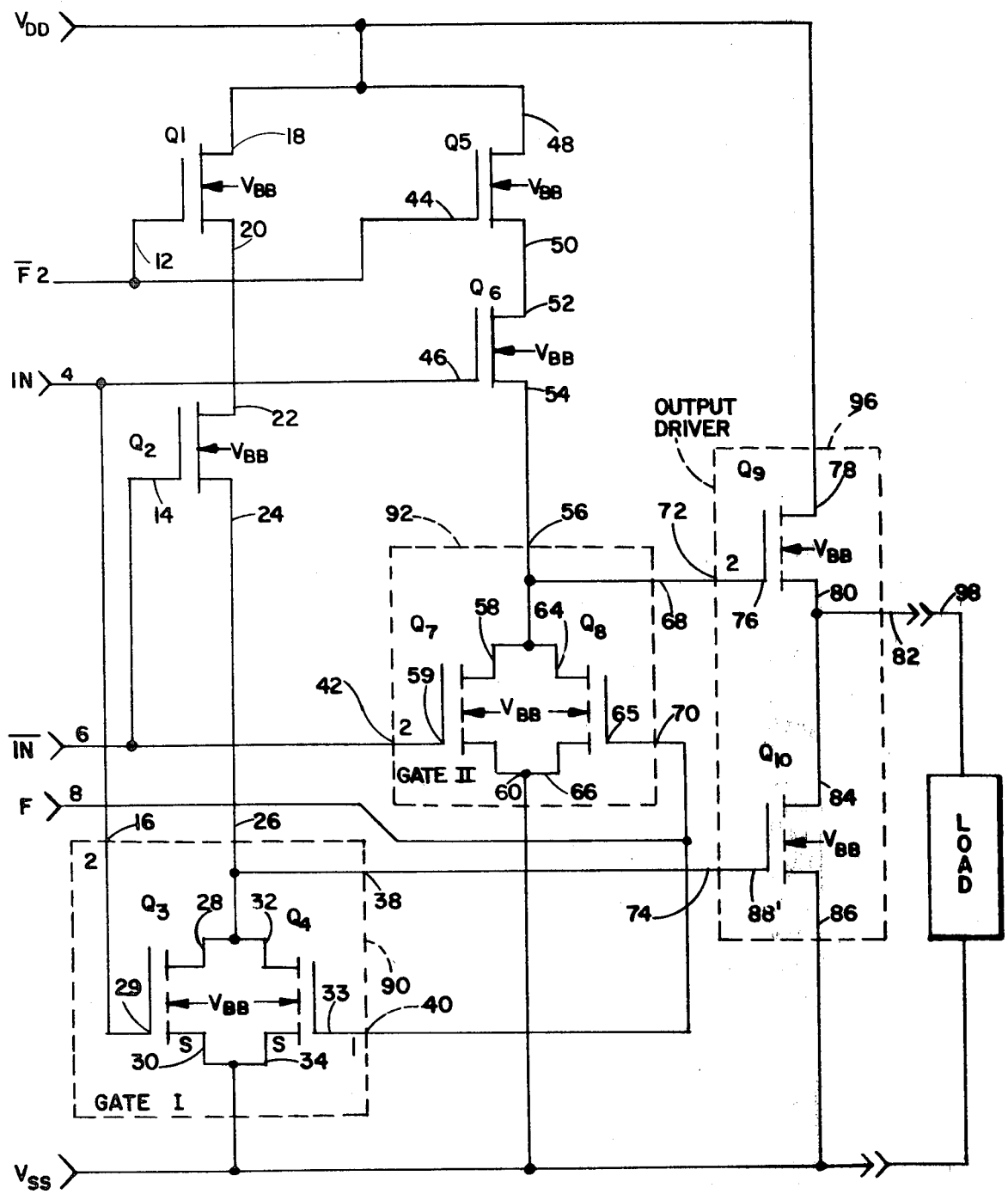
FIG. 1 is a schematic of the improved tristate driver circuit.
Figure 2:
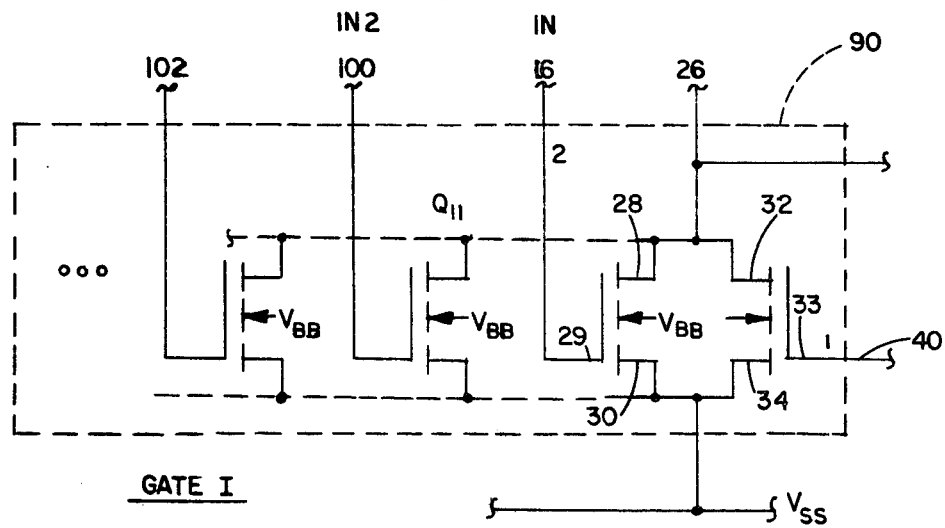
FIG. 2 is a schematic of NOR gate 1 for use in the circuit and having three or more inputs.

FIG. 1 shows the schematic circuit for a preferred embodiment of the improved tristate driver circuit which forms the present invention. Gate I 90 is a NOR gate that is comprised of first and second multi-terminal devices, shown as enhancement mode FETs Q3 and Q4. FETs Q3 and Q4 have their respective drains 28, 32 connected to the first gate output terminal 38 and to the first power gate input terminal 26. The respective sources 30, 34 of FETs Q3 and Q4 are connected to a reference voltage level $V_{SS}$, such as, but not limited to ground. The control terminal 29, or gate of Q3 is connected to the first gate second signal gate input terminal 16 and connected to terminal 4, which is driven by a means providing an input signal, the two state logic level IN. See FIGS. 1 and 2.

Buffer switch Q2 is a multi-terminal semiconductor device, shown as a depletion mode FET. The source 24 of Q2 is connected to the first power gate input terminal 26, and the Q2 drain 22 is connected to the source 20 of Q1. The control terminal 14, or gate of Q2 is connected to terminal 6 where it is driven by the means providing a complement input signal, the two state logic level $\overline{IN}$. Buffer switch Q2 is supplied with power by power interrupt switch Q1.

Power interrupt switch Q1 is a multi-terminal semiconductor device shown as a depletion mode FET. The drain 18 of Q1 is connected to the power source node $V_{DD}$. A "node" is herein a point in a network at which two or more elements are joined and all leads or terminals connected thereto are at the same potential. The control terminal, or gate 12 of Q1 is connected to the means providing a complement float input signal to terminal 2 where it is driven by the two state logic level $\overline{F}$.

Figure 3:
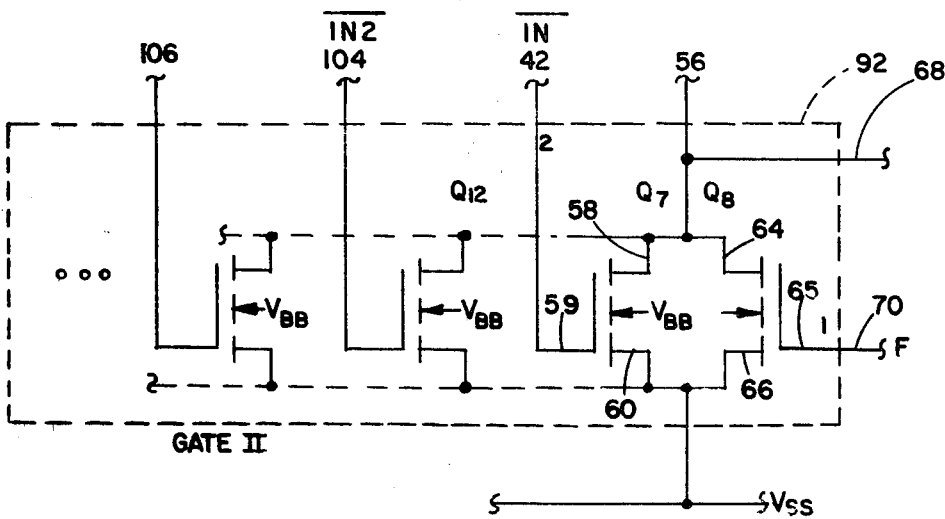
FIG. 3 is a schematic of NOR gate 2 for use in the circuit and having three or more inputs.

Gate II 92 is a NOR gate that is comprised of first and second multi-terminal devices, shown as enhancement mode FETs Q7 and Q8. FETs Q7 and Q8 have their respective drains 58, 64 connected to the second gate output terminal 68 and to the second power gate input terminal 56. The respective sources 60, 66 of Q7 and Q8 are connected to a reference voltage $V_{SS}$, such as, but not limited to ground. The control terminal 59, or gate of Q7 is connected to the second gate, second signal gate input terminal 42, which is connected to terminal 6 and which is driven by a means providing a complement input signal, the two state logic signal $\overline{IN}$. See FIGS. 1 and 3.

Buffer switch Q6 is a multi-terminal semiconductor device, shown as a depletion mode FET. The source 54 of Q6 is connected to the second power gate input terminal 56, and the drain 52 of Q6 is connected to the source 50 of Q5. The control terminal or gate 46 of Q6 is connected to terminal 4 where it is driven by the means providing an input signal, the two state logic level IN. Buffer switch Q6 is supplied with power by power interrupt switch Q5.

Power interrupt switch Q5 is a multi-terminal semiconductor device shown as a depletion mode FET. The drain 48 of switch Q5 is connected to the power source node $V_{DD}$. The control terminal or gate 44 of switch Q5 is connected to terminal 2 where it is driven by the two state logic level $\overline{F}$.

The control terminal, or gate 65 of FET Q8 is connected to the second gate first signal gate input terminal 70, which is connected to the first gate first signal gate input terminal 40 connected to the control terminal, or gate 33 of Q4. The first gate first signal gate input terminal 40 is connected to terminal 8 which is driven by the means providing a float input signal, the two state logic level F.

The output driver 96 is comprised of multi-terminal semiconductor devices Q9 and Q10 as shown as enhancement mode FETs. The source 86 of Q10 is connected to $V_{SS}$ and the drain 84 is connected to the driver output terminal 82. The control terminal or gate 88 of Q10 is connected to the first signal driver input 74. The source 80 of Q9 is connected to the driver output terminal 82 and the drain 78 of Q9 is connected to the power source $V_{DD}$. The control terminal or gate 76 of Q9 is connected to the second signal driver input 72. The first gate output terminal 38 is connected to the first signal driver input terminal 74. The second gate output terminal 68 is connected to the second signal driver input terminal 72.

In connection with a description of the operation of the invention circuit, the following convention will be adapted: A multi-terminal semiconductor device or a FET such as Q3 when driven to a maximum conduction state will be said to be "ON" and when driven to a non-conductive state will be said to be "OFF". A two state logic level is in a logic 1 state when the logic level is within 1.5 V of $V_{DD}$. A two state logic level is in a logic 0 state when the logic level is within 1.0 V of $V_{SS}$.

When the circuit is commanded to begin float state operation, both output driver transistors, Q9 and Q10, are turned off. In this state, Q9 can not supply current to the driver output terminal 82, and Q10 can not switch current from the driver output terminal to $V_{SS}$. The result created is similar to having disconnected the driver output terminal from the output load.

2. Operation

With reference now to FIG. 1 circuit operation when not in the float state will be described. Input signal F on terminal 8 is a logic 0 state signal and input signal $\overline{F}$ on terminal 2 is a logic 1 stage signal. A logic 0 state signal of terminal 8 and on the gates 33, 65 of Q4, and Q8, respectively turns these devices OFF. A logic 1 state signal at terminal 2 on the gates 12, 44 of Q1, and Q5 respectively turns these devices ON. When thus commanded ON, Q1 and Q5 supply current to the drains 22, 52 of Q2, and Q6 respectively. The two state input signal IN at terminal 4 is also a logic 1 state signal and the two state input signal $\overline{IN}$ at terminal 6 is a logic 0 state signal. A logic 1 state input signal on terminal 4 turns Q6 and Q3 ON. A logic 0 state input signal to terminal 6 turns Q7 OFF and Q2 partially OFF. With Q3 ON, Q3 will switch current from Q2 to $V_{SS}$ thereby forcing the first gate output terminal 38 to a logic 0 state. A logic 0 state on the first gate output terminal turns Q10 OFF.

With input signal $\overline{IN}$ on terminal 6 and input signal F on terminal 8 in a logic 0 state, both Q7 and Q8 are OFF while Q5 and Q6 are ON. This provides current to node 56 forcing node 72 to a logic 1 state. A logic 1 state on node 72 turns Q9 ON. With Q9 ON and Q10 OFF, the driver output terminal 82 is also driven to a logic 1 state.

Reversing the state of the input signal IN, terminal 4 to a logic 0 state turns Q3 OFF and Q6 partially OFF. Concurrently reversing the state of the input signal $\overline{IN}$ terminal 6 to a logic 1 state turns Q7 ON and Q2 partially ON. With Q3 and Q4 OFF and Q1 and Q2 ON, node 38 is driven to a logic 1 level turning Q10 ON. Concurrently, with Q7 and Q5 ON and Q6 partially OFF, Q7 operates to switch all current from Q6 to $V_{SS}$ thereby producing a logic 0 state on node 68. A logic 0 state on node 68 turns Q9 OFF. With Q9 OFF and Q10 ON, the driver output 82 is driven to a logic 0 state.

Float mode operation is initiated by commanding terminals 8 (F) and 2 ($\overline{F}$) to logic 1 and logic 0 states respectively. A logic 1 state on terminal 8 turns Q4 and Q8 ON. This insures a logic 0 state on node 38 and node 68. A logic 0 state on nodes 38 and 68 turns Q9 and Q10 respectively completely OFF. With these two output FETs OFF, the output of the circuit will neither supply current to the output load 98 or switch the output load to ground. This condition allows other drivers to control the logic state of the output load 98. The logic 0 state on terminal 2 ($\overline{F}$) commands Q1 and Q5 partially OFF. Q2 or Q6 will also be partially OFF depending on the state of the logic signal IN and $\overline{IN}$ to terminals 4 and 6, respectively.

3. Advantages of Invention Circuit

The use of depletion mode FET transistors at Q1 and Q5 operating in series with the buffer switches Q2 and Q6 solves a longstanding problem, and achieves the object of the improved tristate driver circuit to reduce circuit power dissipation while in the float mode. Depending on the state of the input signal IN, one of the two logic gates is supplied with power by the series combination of two depletion mode FETs, one of which is ON and the other of which is OFF while the other logic gate is supplied with power by a series combination of two depletion mode FETs both of which are OFF. The series combination of the two depletion mode FETs in which both FETs are partially OFF does continue to conduct slightly but the current that does leak through is substantially reduced as is the power. Computer aided modeling of the circuit has shown that a decrease of 29% in power supply current can be realized in float state operation over that obtained with a circuit not having the power interrupting means Q1, Q5 shown.

Further, a logic 1 level to the gates 14, 46 of Q2 and Q6, respectively makes possible a higher initial level of device conductance than would result is the gates of these FETs were connected to their sources. This increased conductance reduces the time required to drive nodes 38 and 68 from a logic 0 state to a logic 1 state. In practice, the size of the Q1 and Q2 pair of depletion mode FETs and the Q5 and Q6 pair of depletion mode FETs are designed to obtain static and dynamic characteristics compatible with the circuit application.

In practice, the output transistors Q9 and Q10 are preferably large geometry devices capable of driving high capacitance loads. They may be from ten to one hundred times the size of a single general purpose FET used elsewhere in the LSI. The Q2 and Q6 buffer switches are driven by logic levels $\overline{IN}$ and IN to achieve a high initial level of conductance when driving nodes 38 or 68 from a logic 0 state to a logic 1 state. These nodes 38, 68 have distributed capacitance which must be charged up each time the node is driven from a logic 0 state to a logic 1 state.

The invention is preferably fabricated with n-channel silicon gate or metal gate FETs, and particularly n-channel MOS FETs of the enhancement and depletion mode types, but p-channel silicon gate or metal gate FETs may be used. An n-channel device construction requires a $V_{DD}$ source in the range of $+3.5$ to $+18$ $V_{dc}$. Where p-channel devices are used, the $V_{DD}$ source is ordinarily in the range of $-3.5$ to $-18$ $V_{dc}$.

While the circuit described can be constructed using p-channel MOS FET transistors in which case the $V_{DD}$ supply would be a relatively negative source voltage and $V_{SS}$ would be a relatively positive reference level at or near ground potential, the reduced power tristate driver circuit illustrated in FIG. 1 has been constructed using n-channel MOS FET transistors of both depletion and enhancement types, and, thus $V_{DD}$ is a relatively positive source voltage and $V_{SS}$ is a relatively negative reference level. $V_{BB}$ is a substrate voltage source which for n-channel devices is slightly more negative than $V_{SS}$.

The above described embodiments of this are merely descriptive of the circuit principles and are not to be considered limiting. The scope of this invention instead shall be determined from the scope of the following claims including their equivalents.

What is claimed is:

1. A tristate driver circuit adapted to operate between a power source and a reference potential comprising:
   a signal source means having
     means providing an input signal,
     means providing a complement input signal,
     means providing a float input signal,
     means providing a complement float input signal;
   a first gate; a second gate, each said first and second gate having:
     a power gate input terminal adapted to be coupled to said power source,
     a first signal gate input terminal,
     a second signal gate input terminal, and
     a gate output terminal;
   a first buffer switch, a second buffer switch, each said first and second buffer switches having:
     a control electrode and a conduction path connected between said power source and said first and second gate power input terminals respectively;
   an output driver having:
     a first signal driver input terminal connected to said first gate output terminal,
     a second signal driver input terminal connected to said second gate output terminal,
     a driver output terminal;
   said first gate first signal gate input terminal being connected to said means providing a float input signal and to said second gate first signal gate input terminal,
   said first gate second signal gate input terminal being connected to said means providing an input signal and to said second buffer switch control electrode,
   said second gate second signal gate input terminal being connected to said means providing a complement input signal and to said first buffer switch control electrode; and
   means for interrupting power to said first and second conduction paths of said first and second buffer switches responsive to a signal from said complement float input signal means.

2. The tristate driver circuit according to claim 1 in which
   said first and second gates, said first and second buffer switches, said output driver, and said means for signal responsively interrupting power to said first and second conduction paths of said first and second buffer switches each comprise a multi-terminal semiconductor device having a conduction path and a control electrode.

3. The tristate driver circuit according to claim 2 in which
   said devices are FET transistors.

4. The tristate driver circuit according to claim 3 wherein:
   said first and second gates are NOR gates.

5. The tristate driver circuit according to claim 4 in which
   at least one of said first and second gates has three or more input terminals.

6. The tristate driver circuit according to claim 5 in which both of said first and second gates have three or more input terminals.

7. A tristate driver circuit adapted to operate between a power source and a reference potential comprising:
   a signal source means having
     means providing an input signal,
     means providing a complement input signal,
     means providing a float input signal,
     means providing a complement float input signal;
   a first NOR gate; a second NOR gate, each said first and second NOR gate having:
     a NOR gate power input terminal adapted to be coupled to said power source,
     a first signal gate input terminal,
     a second signal gate input terminal, and
     a gate output terminal;
   a first buffer switch, a second buffer switch, each said first and second buffer switches having:
     a control electrode and a conduction path connected between said power source and said first and second NOR gate power input terminals respectively;
   an output driver having:
     a first signal driver input terminal connected to said first gate output terminal,
     a second signal driver input terminal connected to said second gate output terminal,
     a driver output terminal;
   said first NOR gate first signal gate input terminal being connected to said means providing a float input signal and to said second NOR gate first signal gate input terminal,
   said first NOR gate second signal gate input terminal being connected to said means providing an input signal and to said second buffer switch control electrode,
   said second NOR gate second signal gate input terminal being connected to said means providing a complement float input signal and to said first buffer switch control electrode; and
   means for interrupting power to said first and second conduction paths of said first and second buffer switches responsive to a signal from said complement float input signal means, said first and second NOR gates, said first and second buffer switches, said output driver, and said means for signal responsively interrupting power to said first and second conduction paths of said first and second buffer switches each comprise FET transistors.

8. The tristate driver circuit according to claim 7 in which at least one of said first and second NOR gates has three or more input terminals.

9. The tristate driver circuit according to claim 7 in which both of said first and second NOR gates have three or more input terminals.

10. In a tristate driver circuit for operation between a voltage source and a reference potential such as ground and being particularly adapted for fabrication exclusively from n-channel field effect transistors or exclusively from p-channel field effect transistors and being adapted to receive an input signal and a complement input signal to produce a logic one output level or a logic zero output level and being further adapted to receive a float input signal and a complement float input signal to produce float state operation, the circuit comprising:

a first logic gate having a first and second signal gate input terminal, a power gate input terminal, and an output terminal, a second logic gate having a first and second signal gate input terminal, a power gate input terminal, an output terminal, a first and second buffer switch, each said buffer switch having a conduction channel having a respective first and second terminal and a control grid, said first buffer switch conduction channel second terminal being connected to said first logic gate power gate input terminal, said second buffer switch conduction channel second terminal being connected to said second logic gate power gate input terminal, an output driver having a first signal driver input from the output terminal of said first logic gate and a second signal driver input from the output terminal of said second logic gate, said first buffer switch control grid being connected to said second logic gate second signal gate input terminal and also coupled to said complement input signal, said second buffer switch control grid being connected to said first logic gate second signal gate input terminal and also connected to said input signal, said first and second logic gate first signal gate input terminals being coupled to said float input signal, means for interrupting power from said voltage source to said respective first and second buffer switch conduction channel first terminals, said means for interrupting power having a first and second terminal, a complement float input signal terminal and a power input terminal, said means for interrupting power first terminal being connected to said first buffer switch conduction channel first terminal, said means for interrupting power second terminal being connected to said second buffer switch conduction channel first terminal, said power input terminal being connected to said voltage source, said complement float input signal terminal being connected to said complement float input signal, said means for interrupting power being responsive to said complement float input signal;

whereby, said means for interrupting power operates to reduce the power dissipation of said first and second buffer switches at the onset of said float state operation.

11. The tristate driver circuit according to claim 10, wherein said means for interrupting power to said first and second buffer switches further comprise: a first and fifth depletion mode, insulated gate field effect transistor, each respective field effect transistor having a control grid and a conduction channel having a first and second terminal, said first and fifth field effect transistor conduction channel first terminals being connected to said means for interrupting power power input terminal, said first field effect transistor conduction channel second terminal being connected to said means for interrupting power first terminal, said fifth field effect transistor conduction channel second terminal being connected to said means for interrupting power second terminal, said first and fifth field effect transistor control grids being connected to said means for interrupting power complement float input signal terminal;

whereby, said first and fifth field effect transistors operate to reduce the power dissipation of said first and second buffer switches during float state operation.

12. The tristate drive according to claim 10, wherein, said first and second buffer switches further comprise: a second and sixth depletion mode, insulated gate field effect transistor, each respective field effect transistor having a control grid and a conduction channel having a first and second terminal, said second field effect transistor conduction channel first terminal being connected to said power interrupting means first terminal, said sixth field effect transistor conduction channel first terminal being connected to said power interrupting means second terminal, said second field effect transistor conduction channel second terminal being connected to said first logic gate power input terminal, said sixth field effect transistor conduction channel second terminal being connected to said second logic gate power input terminal, said second field effect transistor control grid being connected to said first buffer switch control grid, said sixth field effect transistor control grid being connected to said second buffer switch control grid;

whereby, said first and second buffer switches operate in response to said logic input signal and said complement logic input signal to apply bias power to only one of said logic gates, and during float state operation one of said buffer switches will operate in series with said means for interrupting power, to provide an additional power interruption to its respective logic gate.

13. The tristate drive according to claim 10, wherein said first logic gate further comprises a third and fourth enhancement mode, insulated gate field effect transistor, said second logic gate further comprises a seventh and eighth enhancement mode, insulated gate field effect transistor, said output driver further comprises a ninth and tenth enhancement mode, insulated gate field effect transistor, and each respective field effect transistor having a respective control grid and a respective conduction channel having a first and second terminal, said third and fourth field effect transistor conduction channel first terminals being connected to said first logic gate power gate input terminal, said third and fourth field effect transistor conduction channel second terminals being connected to said voltage reference, said third field effect transistor control grid being connected to said first logic gate second signal gate input, said fourth field effect transistor control grid being connected to said first logic gate first signal gate input, said seventh and eighth field effect transistor conduction channel first terminals being connected to said second logic gate power gate input terminal, said seventh and eighth field effect transistor conduction channel second terminals being connected to said reference potential, said seventh field effect transistor control grid being connected to said second logic gate second signal gate input terminal, said eighth field effect transistor control grid being connected to said second logic gate first signal gate input terminal, said first logic gate power gate input terminal being connected to said output terminal of said first logic gate and said second logic gate power gate input terminal being connected to said output terminal of said second gate;

whereby, upon selection said first buffer switch cooperates with said third and fourth field effect transistor to provide a nor gate function and upon selection said second buffer switch cooperates with said seventh and eighth field effect transistor to provide a nor gate function.

14. The combination of claim 11, wherein said first and second buffer switches further comprise:

a second and sixth depletion mode, insulated gate field effect transistor, each respective field effect transistor having a control grid and a conduction channel having a first and second terminal, said second field effect transistor conduction channel first terminal being connected to said power interrupting means first terminal, said sixth field effect transistor conduction channel first terminal being connected to said power interrupting means second terminal, said second field effect transistor conduction channel second terminal being connected to said first logic gate power input terminal, said sixth field effect transistor conduction channel second terminal being connected to said second logic gate power input terminal, said second field effect transistor control grid being connected to said first buffer switch control grid, said sixth field effect transistor control grid being connected to said second buffer switch control grid;

whereby said first and second buffer switches operate in response to said logic input signal and said complement logic input signal to apply bias power to only one of said logic gates, and during float state operation one of said buffer switches will operate in series with said means for interrupting power, to provide an additional power interruption to its respective logic gate.

15. The combination of claim 14, wherein;

said first logic gate further comprises a third and fourth enhancement mode, insulated gate field effect transistor, said second logic gate further comprises a seventh and eighth enhancement mode, insulated gate field effect transistor, said output driver further comprises a ninth and tenth enhancement mode, insulated gate field effect transistor, and each respective field effect transistor having a respective control grid and a respective conduction channel having a first and second terminal, said third and fourth field effect transistor conduction channel first terminals being connected to said first logic gate input terminal, said third and fourth field effect transistor conduction channel second terminals being connected to said voltage reference, said third field effect transistor control grid being connected to said first logic gate second input, said fourth field effect transistor control grid being connected to said first logic gate first input, said seventh and eighth field effect transistor conduction channel first terminals being connected to said second logic gate power input terminal, said seventh and eighth field effect transistor conduction channel second terminals being connected to said reference potential, said seventh field effect transistor control grid being connected to said second logic gate second input, said eighth field effect transistor control grid being connected to said second logic gate first input, said first logic gate power input terminal being connected to said output of said first logic gate and said second logic gate power input terminal being connected to said output of said second logic gate;

whereby upon selection said first buffer switch cooperates with said third and fourth field effect transistor to provide a nor gate function and upon selection said second buffer switch cooperates with said seventh and eighth field effect transistor to provide a nor gate function.

16. The combination of claim 15, wherein said field effect transistors are n-channel field effect transistors and wherein said voltage source is a positive voltage with respect to said reference potential and wherein said first logic level is a relatively positive voltage with respect to said second logic level.

17. The combination of claim 15, wherein said field effect transistors are p-channel field effect transistors and wherein said voltage source is a negative voltage with respect to said reference potential and wherein said first logic level is a relatively negative voltage with respect to said second logic level.

* * * * *